US009337276B2

(12) United States Patent
Uehigashi et al.

(10) Patent No.: US 9,337,276 B2
(45) Date of Patent: May 10, 2016

(54) SILICON CARBIDE SEMICONDUCTOR DEVICE HAVING JUNCTION BARRIER SCHOTTKY DIODE

(71) Applicant: DENSO CORPORATION, Kariya, Aichi-pref. (JP)

(72) Inventors: Hideyuki Uehigashi, Obu (JP); Masami Naito, Inazawa (JP); Tomoo Morino, Anjo (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 14/420,381

(22) PCT Filed: Sep. 12, 2013

(86) PCT No.: PCT/JP2013/005412
§ 371 (c)(1),
(2) Date: Feb. 9, 2015

(87) PCT Pub. No.: WO2014/045550
PCT Pub. Date: Mar. 27, 2014

(65) Prior Publication Data
US 2015/0206941 A1     Jul. 23, 2015

(30) Foreign Application Priority Data

Sep. 18, 2012   (JP) .................................. 2012-204595

(51) Int. Cl.
*H01L 29/15* (2006.01)
*H01L 29/16* (2006.01)
(Continued)

(52) U.S. Cl.
CPC .......... *H01L 29/1608* (2013.01); *H01L 21/265* (2013.01); *H01L 29/06* (2013.01); *H01L 29/0692* (2013.01); *H01L 29/47* (2013.01); *H01L 29/872* (2013.01); *H01L 29/045* (2013.01)

(58) Field of Classification Search
USPC ............. 257/77, 73, 155, 267, 449, 453, 471, 257/478, E51.009, E33.051
See application file for complete search history.

(56) References Cited

U.S. PATENT DOCUMENTS 7,851,882 B2    12/2010  Okuno et al.
2006/0131606 A1  6/2006  Cheng
(Continued)

FOREIGN PATENT DOCUMENTS

JP    2002-261295 A    9/2002
JP    2004-281875 A   10/2004
(Continued)

OTHER PUBLICATIONS

International Search Report of the International Searching Authority mailed Dec. 17, 2013 in the corresponding International application No. PCT/JP2013/005412 (and English translation).
(Continued)

*Primary Examiner* — Timor Karimy
(74) *Attorney, Agent, or Firm* — Posz Law Group, PLC

(57) ABSTRACT

A silicon carbide semiconductor device includes a junction barrier Schottky diode including a substrate, a drift layer, an insulating film, a Schottky barrier diode, and a plurality of second conductivity type layers. The Schottky barrier diode includes a Schottky electrode and an ohmic electrode. A PN diode is configured by the plurality of second conductivity type layers and the drift layer, and the plurality of second conductivity type layers is formed in stripes only in a direction parallel to a rod-shaped stacking fault.

8 Claims, 13 Drawing Sheets

(51) Int. Cl.
*H01L 29/872* (2006.01)
*H01L 29/06* (2006.01)
*H01L 21/265* (2006.01)
*H01L 29/47* (2006.01)
*H01L 29/04* (2006.01)

(56) References Cited

U.S. PATENT DOCUMENTS

2006/0292719 A1  12/2006  Lochtefeld et al.
2009/0039361 A1  2/2009   Li et al.
2011/0049568 A1  3/2011   Lochtefeld et al.
2012/0056197 A1  3/2012   Mizukami et al.
2013/0105860 A1  5/2013   Lochtefeld et al.

FOREIGN PATENT DOCUMENTS

JP  2005-340685 A   12/2005
JP  2010-062252 A   3/2010

OTHER PUBLICATIONS

Written Opinion of the International Searching Authority mailed Dec. 17, 2013 in the corresponding International application No. PCT/JP2013/005412 (and English translation).

SILICON CARBIDE SEMICONDUCTOR DEVICE HAVING JUNCTION BARRIER SCHOTTKY DIODE

CROSS REFERENCE TO RELATED APPLICATIONS

This disclosure is a U.S. national stage application of PCT/JP2013/005412 filed on Sep. 12, 2013 and is based on Japanese Patent Application No. 2012-204595 filed on Sep. 18, 2012, the entire contents of which are incorporated herein by reference.

TECHNICAL FIELD

The present disclosure relates to a silicon carbide (SiC) semiconductor device having a junction barrier Schottky diode (JBS) in which a PN diode is added to a Schottky barrier diode (SBD).

BACKGROUND ART

PTL 1 has proposed an SiC semiconductor device having the JBS in which a PN diode is further added to an SBD. Specifically, a Schottky electrode is formed on a surface of an n⁻ type epitaxial layer made of SiC to configure the SBD, and a p type layer is formed in a surface layer of the n⁻ type epitaxial layer, and the Schottky electrode is brought into contact with the surface of the p type layer to configure the PN diode. With the above configuration, a depletion layer formed by a PN junction configuring the PN diode suppresses a reverse leakage current, and obtains a high breakdown voltage.

However, various defects such as a stacking fault present in the n⁻ type epitaxial layer come in contact with the Schottky electrode to form a current path, resulting in such a problem that the reverse leakage current increases to affect a device yield.

CITATION LIST

Patent Literature

PTL 1: JP 2009-16603 A (corresponding to U.S. Pat. No. 7,851,882 B2)

SUMMARY OF INVENTION

It is an object of the present disclosure to provide an SiC semiconductor device that reduces a current path caused by a contact of a defect with a Schottky electrode, and suppresses a reverse leakage current, thereby being capable of improving a device yield.

An SiC semiconductor device according to one aspect of the present disclosure includes a junction barrier Schottky diode including a substrate, a drift layer, an insulating film, a Schottky barrier diode, and a plurality of second conductivity type layers.

The substrate includes a main front surface and a rear surface, and is made of silicon carbide of a first conductivity type having an off angle. The drift layer is formed on the main front surface of the substrate, and is made of silicon carbide of the first conductivity type which is lower in impurity concentration than the substrate. The insulating film is disposed on the drift layer, and has an opening in a cell portion of the drift layer.

The Schottky barrier diode includes a Schottky electrode and an ohmic electrode. The Schottky electrode is formed in the cell portion and is formed to come in Schottky contact with the surface of the drift layer through the opening of the insulating film. The ohmic electrode is formed on the rear surface of the substrate. The plurality of second conductivity type layers is formed to be connected to the Schottky electrode on the surface of the drift layer below a region of the Schottky electrode which comes in contact with the drift layer, and is arranged to be spaced apart from each other.

The PN diode is configured by the plurality of second conductivity type layers and the drift layer. The plurality of second conductivity type layers is formed in strips only in a direction parallel to a rod-shaped stacking fault.

In the SiC semiconductor device, the plurality of second conductivity type layers is laid out in stripes, and a longitudinal direction of each of the second conductivity type layers is arranged in parallel to the rod-shaped stacking fault. For that reason, all or most of defects such as the stacking fault formed in the drift layer can be placed within each of the second conductivity type layers. Accordingly, a current path caused by a contact between a crystal defect and the Schottky electrode can be reduced, a reverse leakage current can be suppressed, and a device yield can be improved.

An SiC semiconductor device according to another aspect of the present disclosure includes a junction barrier Schottky diode having a substrate, a drift layer, an insulating film, a Schottky barrier diode, and a plurality of second conductivity type layers.

The substrate includes a main front surface and a rear surface, and is made of silicon carbide of a first conductivity type having an off angle. The drift layer is formed on the main front surface of the substrate, and is made of silicon carbide of the first conductivity type which is lower in impurity concentration than the substrate. The insulating film is disposed on the drift layer, and has an opening in a cell portion of the drift layer.

The Schottky barrier diode includes a Schottky electrode and an ohmic electrode. The Schottky electrode is formed in the cell portion and is formed to come in Schottky contact with the surface of the drift layer through the opening of the insulating film. The ohmic electrode is formed on the rear surface of the substrate. The plurality of second conductivity type layers is formed to be connected to the Schottky electrode on the surface of the drift layer below a region of the Schottky electrode which comes in contact with the drift layer, and is arranged to be spaced apart from each other.

The PN diode is configured by the plurality of second conductivity type layers and the drift layer. The plurality of second conductivity type layers is formed in strips only in a direction perpendicular to a rod-shaped stacking fault. When an off angle of the substrate is θ, and a thickness of the drift layer is d, each width of the plurality of second conductivity type layers is $d/\tan\theta$ or more.

In the SiC semiconductor device, the width of each of the second conductivity type layers is set to $d/\tan\theta$ or more. Therefore, the stacking fault extending in an off direction is more likely to be included in the second conductivity type layer, and at least a part of the stacking fault can be further more likely to be included in the second conductivity type layer. Accordingly, a current path caused by a contact between a crystal defect and the Schottky electrode can be reduced, a reverse leakage current can be suppressed, and a device yield can be improved.

BRIEF DESCRIPTION OF DRAWINGS

The above and other objects, features and advantages of the present disclosure will become more apparent from the following detailed description made with reference to the accompanying drawings. In the drawings.

DESCRIPTION OF EMBODIMENTS

Hereinafter, embodiments of the present disclosure will be described with reference to the accompanying drawings. In the following respective embodiments, parts identical with or equivalent to each other are denoted by the same symbols for description.

First Embodiment

Figure 1:
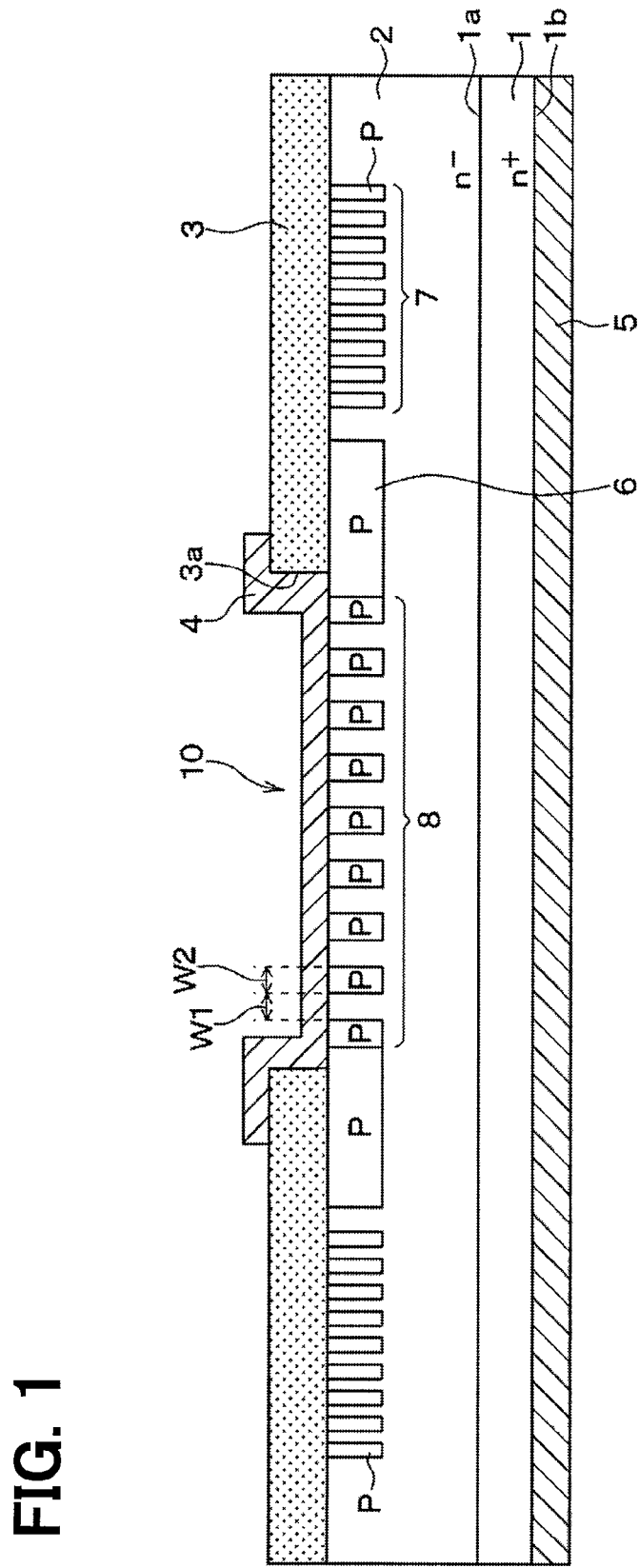
FIG. 1 is a cross-sectional view of an SiC semiconductor device having an SBD according to a first embodiment of the present disclosure.

A first embodiment of the present disclosure will be described. First, a structure of an SiC semiconductor device manufactured by a method for manufacturing the SiC semiconductor device according to the present embodiment will be described with reference to FIGS. 1 to 3. FIG. 1 corresponds to a cross-sectional view taken along a line I-I in FIGS. 2 and 3. Also, although FIG. 3 is not a cross-sectional view, FIG. 3 is partially hatched for clarifying the figure.

Figure 2:
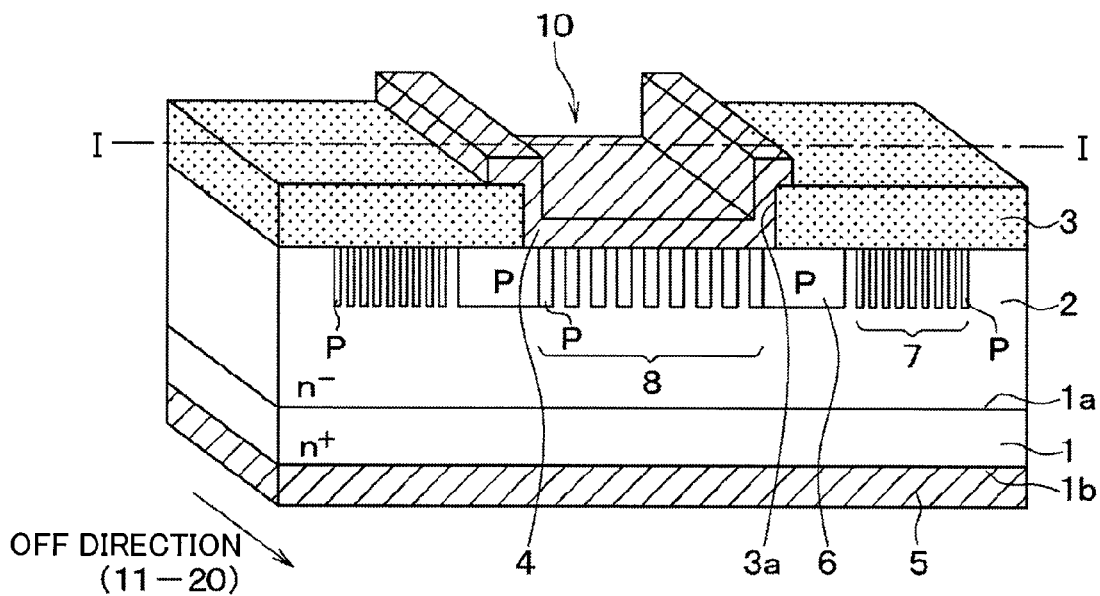
FIG. 2 is a perspective cross-sectional view of the SiC semiconductor device illustrated in FIG. 1.
Figure 3:
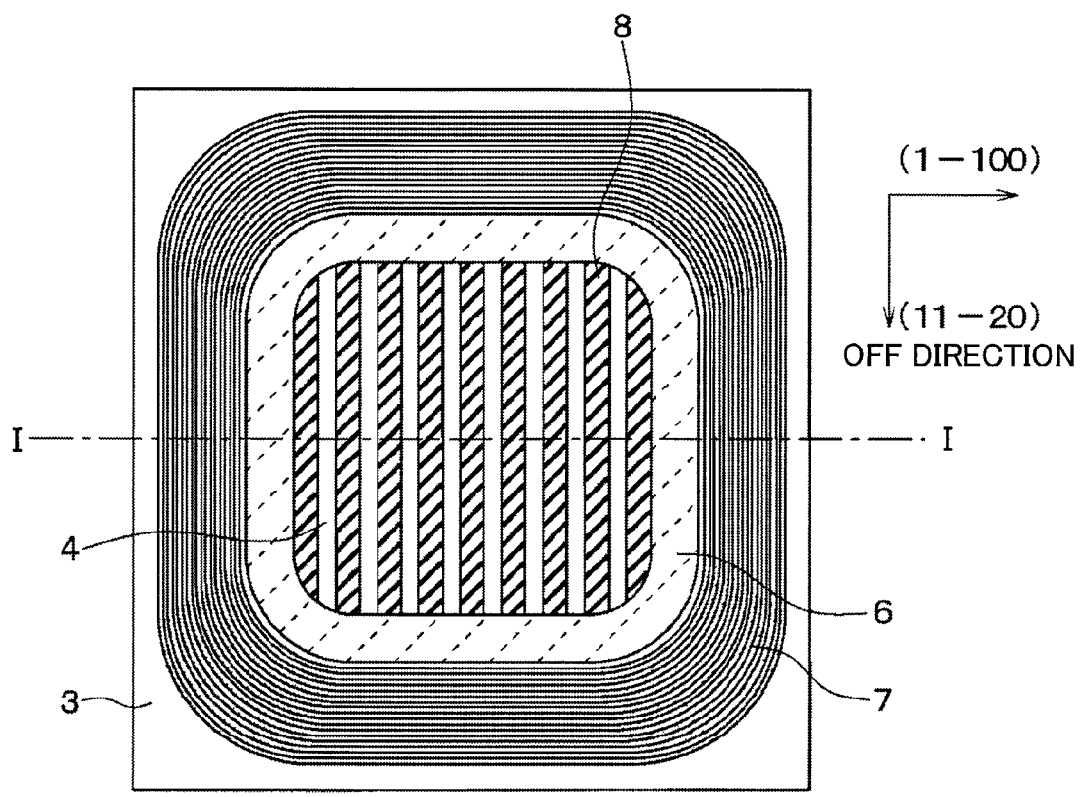
FIG. 3 is a top layout view of the SiC semiconductor device illustrated in FIG. 1.

As illustrated in FIGS. 1 and 2, the SiC semiconductor device is formed of an n$^+$ type substrate 1 made of SiC which is, for example, about $2\times10^{18}$ to $1\times10^{21}$ cm$^{-3}$ in impurity concentration. When it is assumed that an upper surface of the n$^+$ type substrate 1 is a main front surface 1a, and a lower surface that is an opposite surface of the main front surface 1a is a rear surface 1b, an n$^-$ type epitaxial layer (drift layer) 2 made of SiC that is lower in dopant concentration than the substrate 1 is stacked on the main front surface 1a. The n$^-$ type epitaxial layer 2 is set to, for example, $1\times10^{14}$ to $1\times10^{17}$ cm$^{-3}$ in impurity concentration. An SBD 10 is formed in a cell portion of the SiC semiconductor device configured by the n$^+$ type substrate 1 and the n$^-$ type epitaxial layer 2, and a termination structure is formed in an outer peripheral region thereof to configure the SiC semiconductor device.

Specifically, the n$^+$ type substrate 1 is formed of an SiC substrate in which the main front surface 1a has an off angle to, for example, a surface (0001). In the present embodiment, as illustrated in FIGS. 2 and 3, an off direction is set to a direction (11-20), and the SiC substrate having the off angle of, for example, 4 degrees is used as the n$^+$ type substrate 1. Then, the n$^-$ type epitaxial layer 2 is formed on the n$^+$ type substrate 1 by epitaxial growth, and the n$^-$ type epitaxial layer 2 is also made of crystal in which the direction (11-20) is set as the off direction. It is preferable that there are few crystal defects in the n$^+$ type substrate 1 and the n$^-$ type epitaxial layer 2, but defects such as stacking faults are generated when the n$^-$ type epitaxial layer 2 is allowed to grow on the n$^+$ type substrate 1. For that reason, defects such as the stacking faults are present in the n$^-$ type epitaxial layer 2. In addition, the crystal defects existing in the n$^+$ type substrate 1 have a property of propagating through the n$^-$ type epitaxial layer 2, which also causes the defects to enter the n$^-$ type epitaxial layer 2.

An insulating film 3 formed of, for example, a silicon oxide film is formed on a surface of the n$^-$ type epitaxial layer 2. An opening 3a is partially formed in the cell portion in the insulating film 3, and a Schottky electrode 4 that is brought into contact with the n$^-$ type epitaxial layer 2 is formed in the opening 3a of the insulating film 3. The Schottky electrode 4 is made of a material such as Au (gold), Ni (nickel), Ti (titanium), or Mo (molybdenum) which comes in Schottky contact with the n type epitaxial layer 2 to enable a contact with a p type layer 8, which will be described later, to be brought into an insulating state. An ohmic electrode 5 made of, for example, Au, Ni, Ti, or Mo is formed to come in contact with the rear surface of the n+ type substrate 1. With the above configuration, the SBD 10 is formed. The SBD 10 may have any upper surface layout, but in the present embodiment, the upper surface layout is shaped into a square having each corner rounded as illustrated in FIG. 3.

Also, as the termination structure formed in an outer peripheral region of the SBD 10, a p type surface field relaxation (resurface) layer 6 is formed in a surface portion of the n⁻ type epitaxial layer 2 in the outer peripheral portion of the Schottky electrode 4 so as to come in contact with the Schottky electrode 4. In addition, plural p type guard ring layers 7 are arranged so as to further surround the outer periphery of the p type resurf layer 6. The p type resurf layer 6 and the p type guard ring layers 7 configure the terminal structure. The p type resurf layer 6 and the p type guard ring layers 7 contain, for example, Al as impurities, and have the impurity concentration of, for example, about $5\times10^{16}$ to $1\times10^{19}$ cm$^{-3}$. With the arrangement of the p type resurf layer 6 and the p type guard ring layer 7, an electric field can extend extensively in the outer periphery of the SBD 10, and can relax the electric field concentration. For that reason, a breakdown voltage can be improved. With the above structure, the SBD 10 is configured.

Although not shown, a joint electrode forming a barrier layer and a surface electrode for external connection can be stacked on a surface of the Schottky electrode 4 in order, and a bonding wire is connected to a surface of the surface electrode to achieve an electric connection between the SBD 10 and the external.

Moreover, the p type layers 8 configured to come in contact with the Schottky electrode 4 are formed further inside of an end of the inside (inner peripheral side) of the p type resurf layer 6 which is located on a most cell portion side of a portion forming the termination structure. As illustrated in FIG. 3, the p type layers 8 are shaped into stripes configured so that plural strips having the same direction as the off direction as a longitudinal direction are aligned in a direction (1-100). As illustrated in FIG. 1, the respective p type layers 8 are spaced apart from each other by equal intervals W1 so as to be symmetrically arranged with respect to a center of the cell portion, and structured so that widths W2 of the respective p type layers 8 are also equal to each other. The p type layers 8 of this type are, for example, about $5\times10^{17}$ to $1\times10^{20}$ cm$^{-3}$ in impurity concentration. The intervals W1 of the respective p type layers 8 are set to, for example, 2.0±0.5 µm. The widths W2 of the respective p type layers 8 are set to be equal to or larger than a thickness of a rod-shaped stacking fault formed within the n⁻ type epitaxial layer 2, that is, a width of the stacking fault in a direction perpendicular to the off direction (a dimension in the direction (1-100) in the present embodiment), for example, set to be equal to or larger than 1 µm, and equal to or smaller than 3 µm. Also, depths of the respective p type layers 8 are set to be equal to or larger than 0.3 µm and equal to or smaller than 1.0 µm, for example.

The PN diode is formed between the p type layers 8 configured as described above and the n⁻ type epitaxial layer 2. However, contacts between the surfaces of the p type layers 8 and the Schottky electrode 4 of the p type layer 8 become in an insulating state because the Schottky electrode 4 can be made of Au, Ni, Ti, or Mo to extremely increase contact resistances between the p type layers 8 and the Schottky electrode 4. With the above configuration, a JBS having a PN diode in addition to the SBD 10 is configured.

In the SiC semiconductor device having the SBD 10 structured as described above, the Schottky electrode 4 functions as an anode, and the ohmic electrode 5 functions as a cathode. Specifically, a voltage that exceeds the Schottky barrier is applied to the Schottky electrode 4 whereby a current flows between the Schottky electrode 4 and the ohmic electrode. Also, because the p type resurf layer 6 and the p type guard ring layers 7 are provided in the outer peripheral region, equipotential lines can extend extensively without bias. As a result, a high breakdown voltage element can be provided.

Also, in the present embodiment, the p type layers 8 extend with the off direction as the longitudinal directions. In other words, the p type layers 8 are shaped into stripes that extend only in a direction parallel to the stacking fault formed in the n⁻ type epitaxial layer 2. For that reason, all or most of the defects such as the stacking defect formed in the n⁻ type epitaxial layer 2 can be placed within the respective p type layers 8. Since the contact resistance between the surfaces of the respective p type layers 8 and the Schottky electrode 4 are extremely large, and put in an insulating state, all or most of crystal defects enter the respective p type layers 8, thereby being capable of reducing a current path caused by a contact between the crystal defects and the Schottky electrode. Therefore, the reverse leakage current can be suppressed, and the device yield can be improved.

Subsequently, a method for manufacturing the SiC semiconductor device according to the present embodiment will be described with reference to FIGS. 4A to 4E. In FIGS. 4A to 4E, the p type guard ring layers 7 are omitted.

Figure 4A:
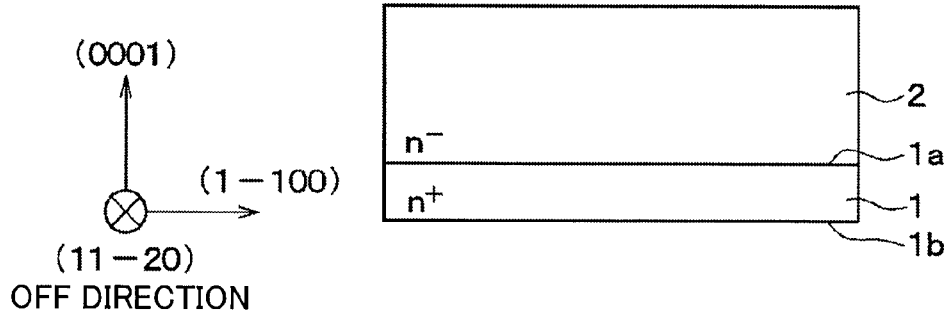
FIG. 4A is a cross-sectional view partially illustrating a process of manufacturing the SiC semiconductor device illustrated in FIG. 1.
Figure 4B:
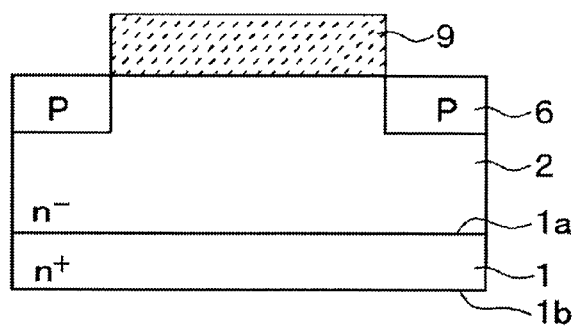
FIG. 4B is a cross-sectional view partially illustrating a process of manufacturing the SiC semiconductor device illustrated in FIG. 1.

First, in a process illustrated in FIG. 4A, the n⁻ type drift layer 2 is allowed to epitaxially grow on the main front surface 1a of the n+ type substrate 1. Subsequently, in a process illustrated in FIG. 4B, after a mask 9 formed of a low temperature oxide film (LTO) or the like has been placed, regions of the mask 9 in which the p type resurf layer 6 and the p type guard ring layer 7 are to be formed are opened in a photolithography etching process. Then, p type impurity such as Al is ion-implanted with the use of the mask 9, and activated by heat treatment to form the p type resurf layer 6 and the p type guard ring layers 7.

Figure 4C:
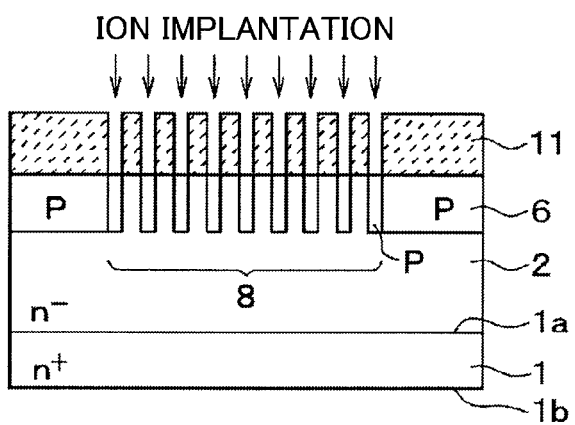
FIG. 4C is a cross-sectional view partially illustrating a process of manufacturing the SiC semiconductor device illustrated in FIG. 1.
Figure 4D:
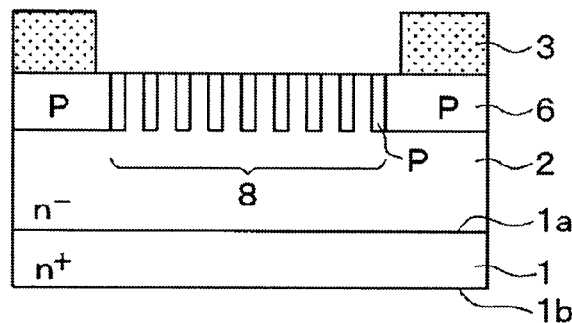
FIG. 4D is a cross-sectional view partially illustrating a process of manufacturing the SiC semiconductor device illustrated in FIG. 1.
Figure 4E:
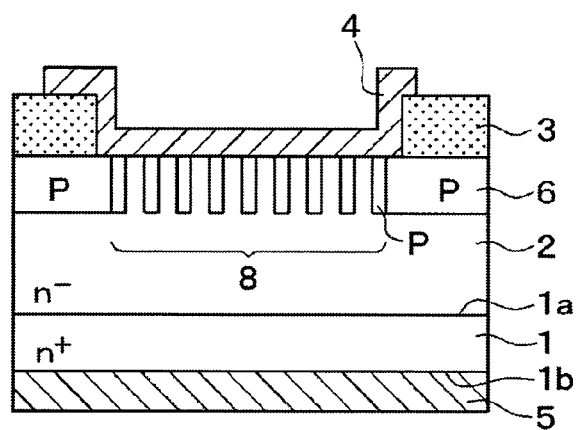
FIG. 4E is a cross-sectional view partially illustrating a process of manufacturing the SiC semiconductor device illustrated in FIG. 1.

Subsequently, in a process illustrated in FIG. 4C, after the mask 9 is removed, a mask 11 formed of a low temperature oxide film (LTO) is placed, a regions of the mask 11 in which the p type layers 8 are to be formed are opened in a photolithography etching process. In this case, most of the crystal defects are included in the regions in which the p type layers 8 are to be formed even if mask alignment is performed without checking the defects such as stacking faults. However, if the mask alignment is performed while confirming the crystal defects, more crystal defects can be included in the regions where the p type layers 8 are to be formed. For example, since defect positions can be recognized in photoluminescence, appropriate defect positions can be grasped by the recognized defect positions in advance, and then mask alignment can be performed.

Then, p type impurity such as Al is ion-implanted with the use of the mask 11, and activated by heat treatment to form the p type layers 8. Then, in a process illustrated in FIG. 4D, after the mask 11 has been removed, for example, after a silicon oxide film has been formed by plasma CVD, the silicon oxide film is subjected to a reflow process to form the insulating film 3, and the opening 3a is formed in the insulating film 3 through a photolithographic etching process. Then, in a process illustrated in FIG. 4E, after a metal layer for forming the Schottky electrode 4 has been formed on the insulating film 3 with the inclusion of the opening 3a, the metal layer is patterned to form the Schottky electrode 4. Further, a metal layer made of Ni, Ti, Mo, or W is formed on the rear surface 1b side of the n$^+$ type substrate 1, to thereby form the ohmic electrode 5. With the above processes, the SiC semiconductor device, having the SBD 10 illustrated in FIG. 1 is completed.

As described above, in the present embodiment, the p type layers 8 are laid out in stripes, and longitudinal directions of the respective p type layers 8 are arranged in parallel to the rod-shaped stacking fault, that is, in the same direction as the off direction. For that reason, all or most of the crystal defects such as the stacking faults formed in the n$^-$ type epitaxial layer 2 can be placed within the respective p type layers 8. Accordingly, the current path caused by a contact between crystal defects and the Schottky electrode can be reduced, the reverse leakage current can be suppressed, and a device yield can be improved.

Figure 5A:
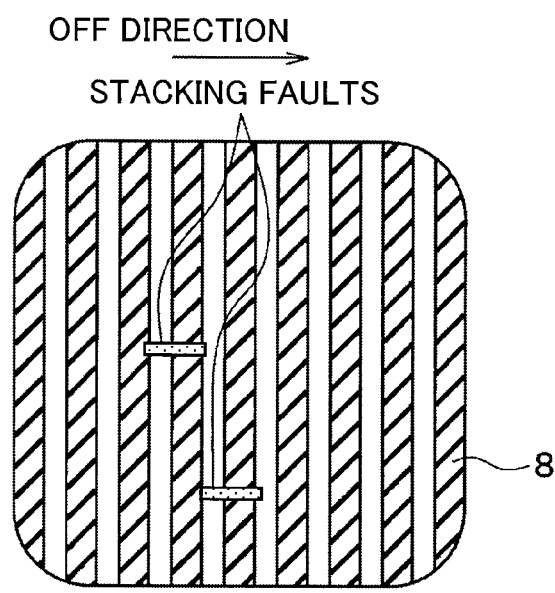
FIG. 5A is a top view illustrating a state of stacking faults when longitudinal directions of p type layers are perpendicular to the off direction.
Figure 5B:
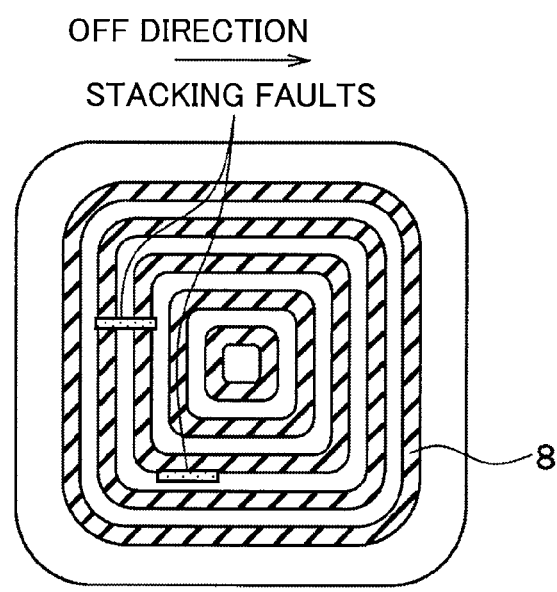
FIG. 5B is a top view illustrating a state of the stacking faults when p type layers are concentrically arranged.
Figure 5C:
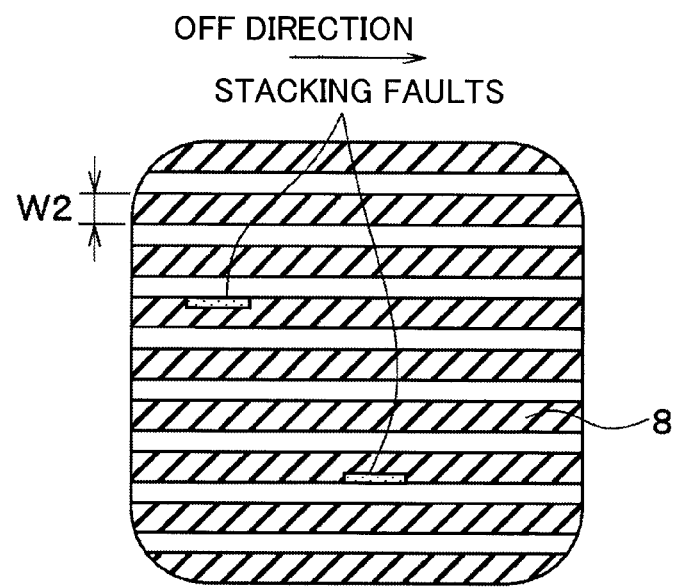
FIG. 5C is a top view illustrating a state of the stacking faults when longitudinal directions of p type layers are arranged in parallel to the off direction.

That is, if the longitudinal directions of the p type layers 8 are arranged in a direction perpendicular to the off direction as illustrated in FIG. 5A, or the p type layers 8 have plural frame shapes concentrically arranged as illustrated in FIG. 5B, portions of the stacking faults extending in the off direction which enter the p type layers 8 are reduced. Although a mechanism in which the current path is formed is not clear, it has been confirmed that a leakage current is reduced more as a rate of the crystal defect included within the p type layers 8 is larger. If the portions of the stacking faults which enter the p type layers 8 are reduced as illustrated in FIGS. 5A and 5B, the leakage current is not sufficiently suppressed. On the contrary, as in the present embodiment, when the longitudinal directions of the p type layers 8 are arranged in the same direction as the off direction, portions of the stacking faults extending in the off direction which enter the p type layers 8 can more increase as illustrated in FIG. 5C. As a result, the leakage current can be further suppressed.

In this way, the longitudinal directions of the respective p type layers 8 are arranged in the direction parallel to the rod-shaped stacking faults, that is, in the same direction as the off direction, thereby being capable of obtaining the above advantages. It is preferable that all of the defects such as the stacking faults wholly enter the p type layers 8, but it is confirmed that the above advantages are obtained even if the more defects enter the p type layers 8. For that reason, even if all of the defects such as the stacking faults do not enter the p type layers 8, when the longitudinal directions of the respective p type layers 8 are arranged in the same direction as the off direction, more defects can enter the p type layers 8, and the above advantages can be obtained.

Second Embodiment

A second embodiment of the present disclosure will be described. In the present embodiment, the off direction, the longitudinal direction of the p type layers 8, and the method for manufacturing the SiC semiconductor device are changed as compared with the first embodiment, and because the other configurations are identical with those in the first embodiment, only portions different from those in the first embodiment will be described.

Figure 6:
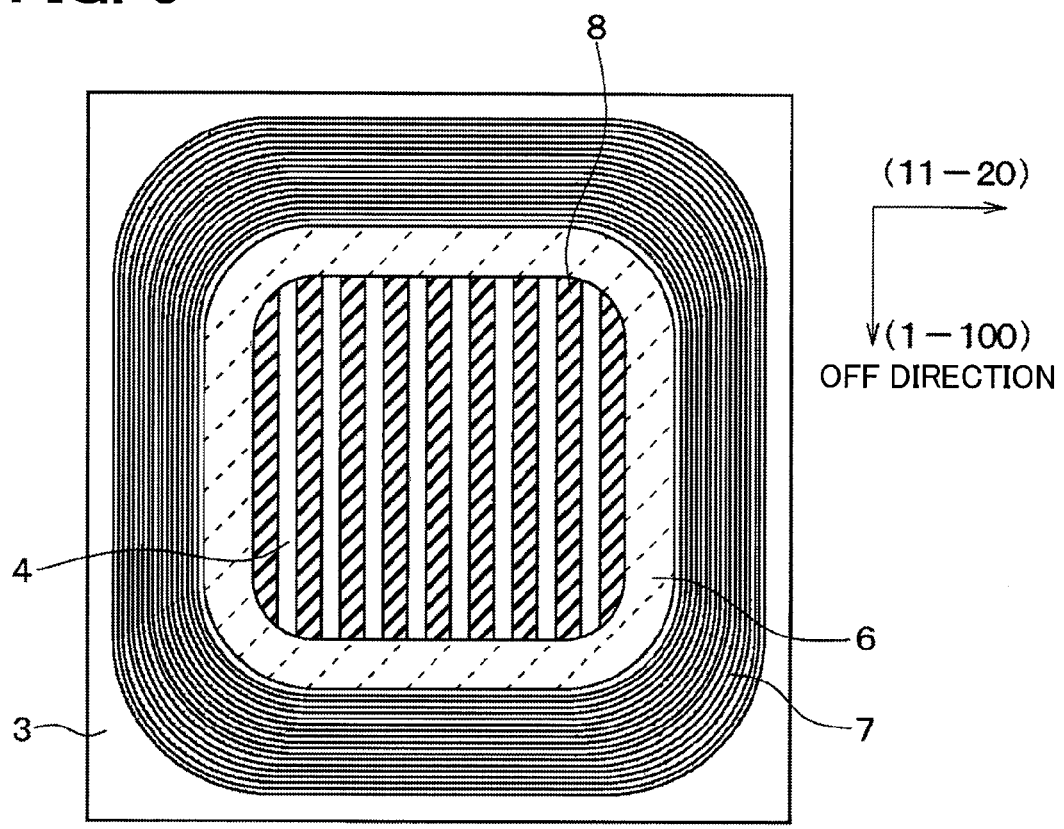
FIG. 6 is a top layout view of an SiC semiconductor device having an SBD according to a second embodiment of the present disclosure.
Figure 7A:
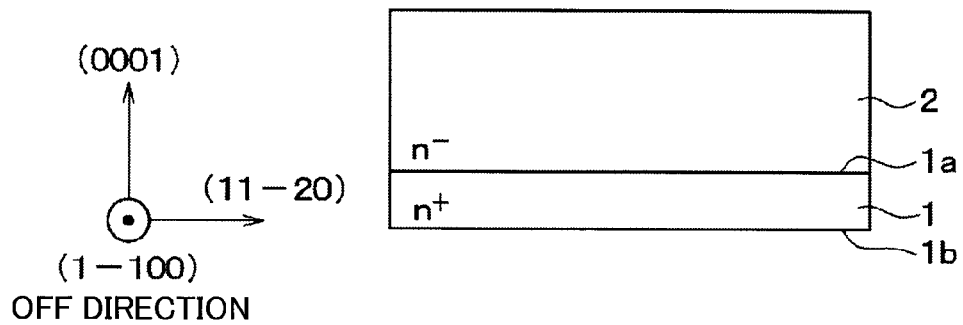
FIG. 7A is a cross-sectional view partially illustrating a process of manufacturing the SiC semiconductor device illustrated in FIG. 6.
Figure 7B:
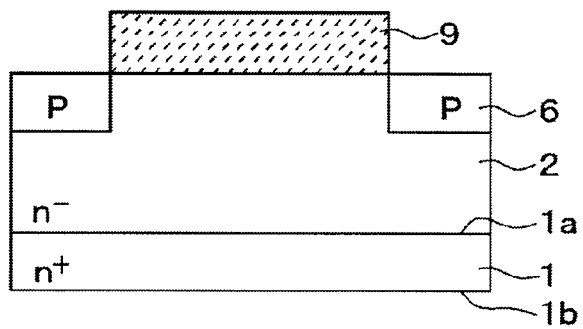
FIG. 7B is a cross-sectional view partially illustrating a process of manufacturing the SiC semiconductor device illustrated in FIG. 6.
Figure 7C:
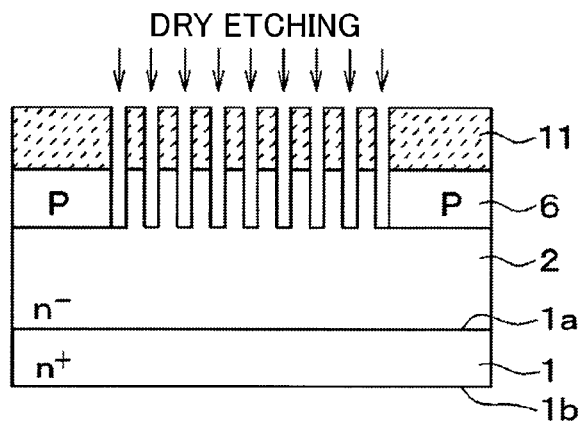
FIG. 7C is a cross-sectional view partially illustrating a process of manufacturing the SiC semiconductor device illustrated in FIG. 6.
Figure 7D:
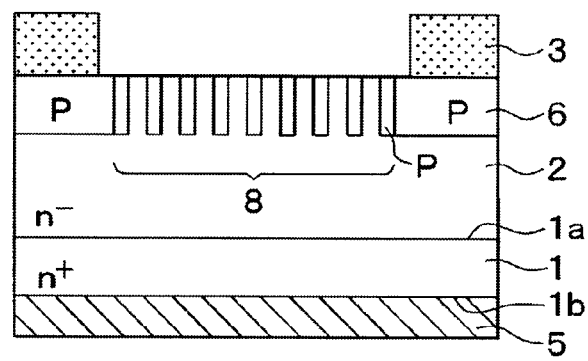
FIG. 7D is a cross-sectional view partially illustrating a process of manufacturing the SiC semiconductor device illustrated in FIG. 6.
Figure 7E:
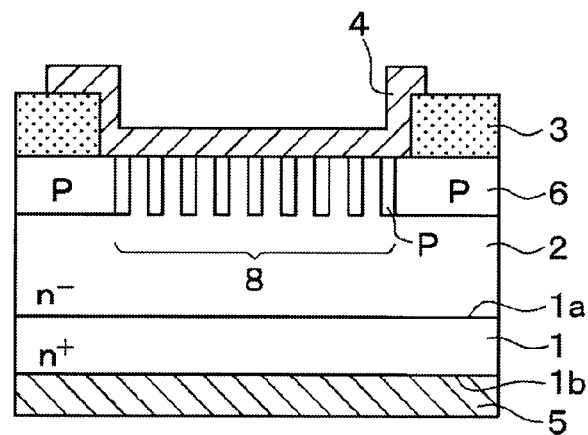
FIG. 7E is a cross-sectional view partially illustrating a process of manufacturing the SiC semiconductor device illustrated in FIG. 6.

As illustrated in FIG. 6, in the present embodiment, an SiC substrate having an off angle where an off direction to a (0001) plane is a (1-100) direction is used as the n$^+$ type substrate 1. Also, the n$^-$ type epitaxial layer 2 formed on the n$^+$ type substrate 1 is crystalline with the (1-100) direction as the off direction. Then, the p type layers 8 having longitudinal directions in the same direction as the (1-100) direction which is the off direction is formed on the n$^-$ type epitaxial layer 2 configured as described above.

Subsequently, a method for manufacturing the SiC semiconductor device according to the present embodiment will be described with reference to FIGS. 7A to 7E. In FIGS. 7A to 7E, the p type guard ring layers 7 are omitted.

First, an SiC substrate having an off angle where an off direction to a (0001) plane is a (1-100) direction is prepared as the n$^+$ type substrate 1. Then, as processes illustrated in FIGS. 7A and 7B, the same processes as those in FIGS. 4A and 4B described in the first embodiment are performed. Subsequently, in a process illustrated in FIG. 7C, a mask 11 made of an LTO or the like is arranged, and regions of the mask 11 in which the p type layers 8 are to be formed are opened in a photolithography etching process. Even in this case, most of the crystal defects are included in the regions in which the p type layers 8 are to be formed even if mask alignment is performed without checking the defects such as stacking faults. However, if the mask alignment is performed while confirming the crystal defects, more crystal defects can be included in the regions where the p type layers 8 are to be formed.

Then, dry etching is performed with the use of the mask 11 to form grooves with the removal of the n$^-$ type epitaxial layer 2 in the regions where the p type layers 8 are to be formed. Then, after the mask 11 has been removed, the p type layers 8 are allowed to epitaxially grow on an overall surface of the n$^-$ type epitaxial layer 2 including the inside of the grooves, and unnecessary portions of the p type layers 8 are removed, or the p type layers 8 are allowed to epitaxially grow only within the grooves selectively, to thereby form the p type layers 8. Thereafter, as processes illustrated in FIGS. 7D and 7E, the same processes as those in FIGS. 4D and 4E described in the first embodiment are performed. As a result, the SiC semiconductor device according to the present embodiment is completed.

In this way, a structure in which the off direction and the longitudinal directions of the p type layers 8 are changed as compared with the SiC semiconductor device described in the first embodiment is provided. In this way, even if the off direction and the longitudinal directions of the p type layers 8 are changed, the same advantages as those in the first embodiment can be obtained. Also, in the first embodiment, the p type layers 8 are formed by ion implantation. Alternatively, as in the present embodiment, the p type layers 8 can be formed to epitaxially grow within the grooves formed by dry-etching the n$^-$ type epitaxial layer 2.

Third Embodiment

A third embodiment of the present disclosure will be described. In the present embodiment, a relationship between the off direction and the longitudinal directions of the p type layers 8, and the widths W2 of the p type layers 8 are changed as compared with the first embodiment, and because the other configurations are identical with those in the first embodiment, only portions different from those in the first embodiment will be described.

Figure 8:
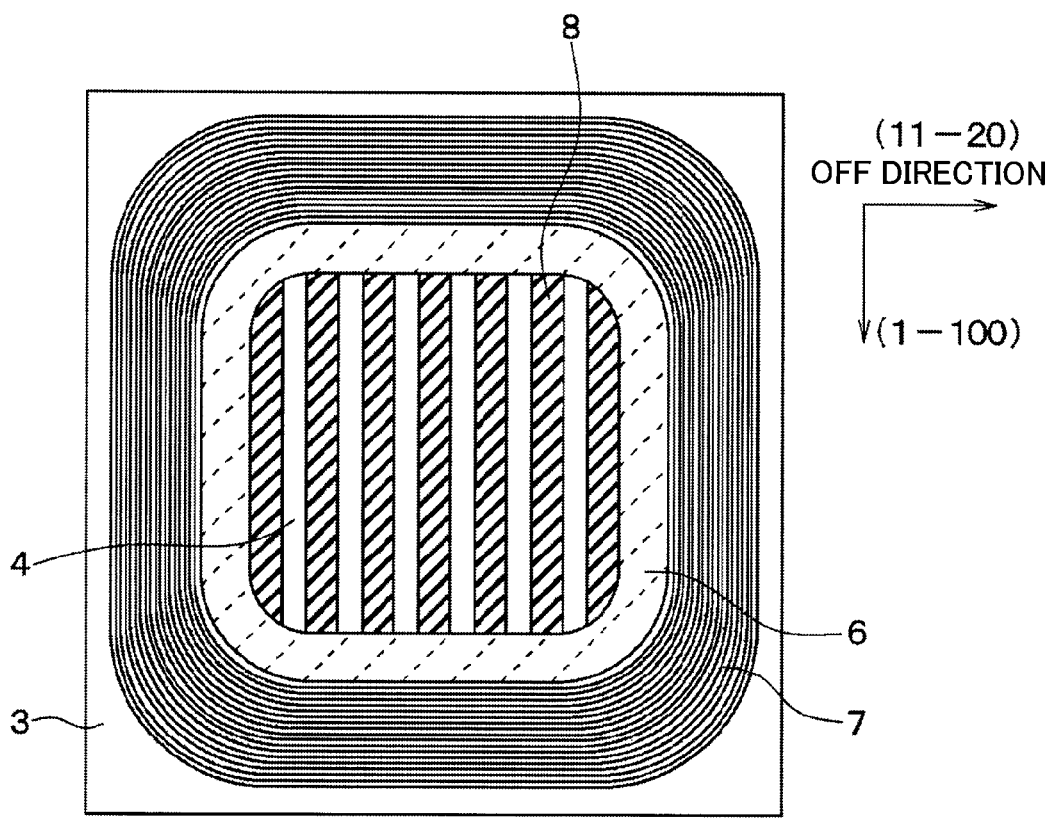
FIG. 8 is a top layout view of an SiC semiconductor device having an SBD according to a third embodiment of the present disclosure.
Figure 9:
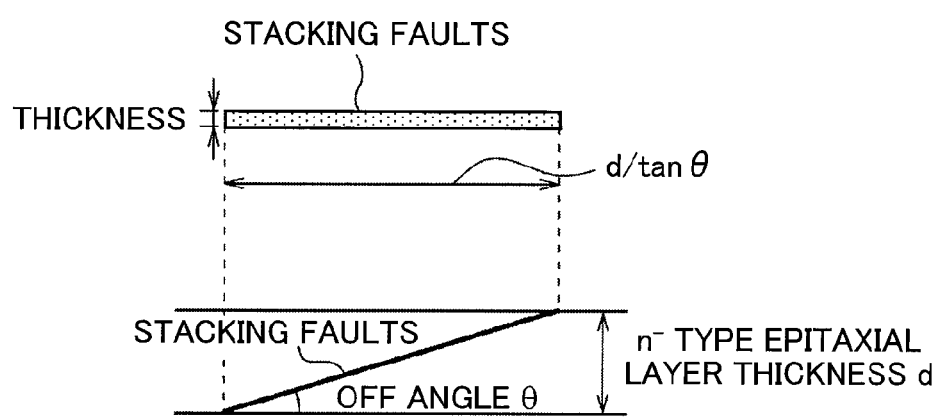
FIG. 9 is a diagram illustrating a state of stacking faults viewed in a normal direction to a substrate surface, and in a horizontal direction of the substrate.

As illustrated in FIG. 8, in the present embodiment, an SiC substrate having an off angle where an off direction to a (0001) plane is a (1-100) direction is used as the n$^+$ type substrate 1. Also, the n$^-$ type epitaxial layer 2 formed on the n$^+$ type substrate 1 is crystalline with the (1-100) direction as the off direction. Then, the p type layers 8 having longitudinal directions in a direction perpendicular to the (1-100) direction which is the off direction is formed on the n$^-$ type epitaxial layer 2 described above. The widths W2 of the respective p type layers 8 are set taking the length of the stacking faults extending in the same direction as the off direction into account, and set to be equal to or larger than the length of the stacking faults when viewed from a direction normal to the substrate surface as illustrated in FIG. 9. Specifically, as illustrated in FIG. 9, when it is assumed that the off angle is θ, and the thickness of the n⁻ type epitaxial layer 2 is d, the widths W2 of the respective p type layers 8 are set to be equal to or larger than d/tan θ.

Figure 10:
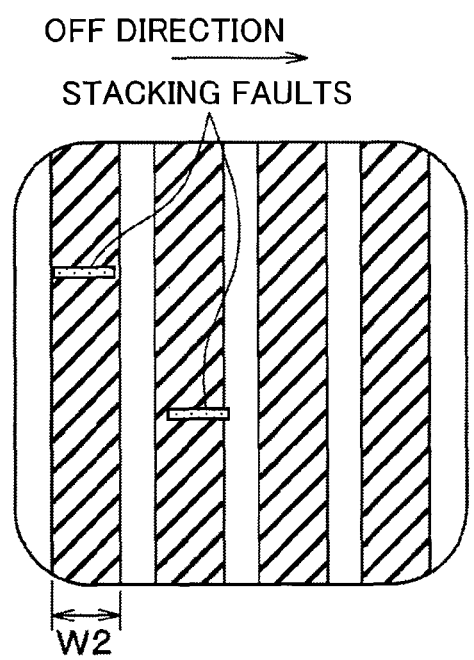
FIG. 10 is a top view illustrating a state of stacking faults when longitudinal directions of p type layers are perpendicular to the off direction.
Figure 11A:
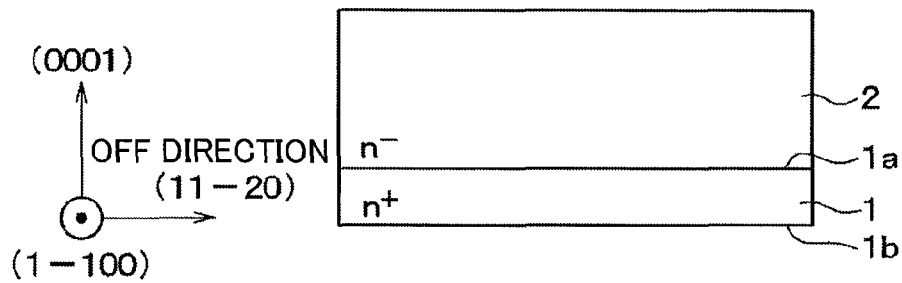
FIG. 11A is a cross-sectional view partially illustrating a process of manufacturing the SiC semiconductor device illustrated in FIG. 8.
Figure 11B:
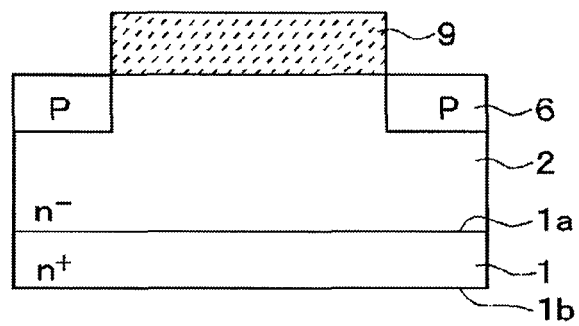
FIG. 11B is a cross-sectional view partially illustrating a process of manufacturing the SiC semiconductor device illustrated in FIG. 8.
Figure 11C:
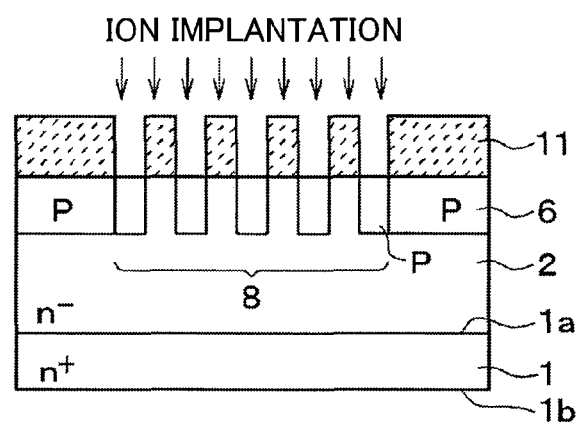
FIG. 11C is a cross-sectional view partially illustrating a process of manufacturing the SiC semiconductor device illustrated in FIG. 8.
Figure 11D:
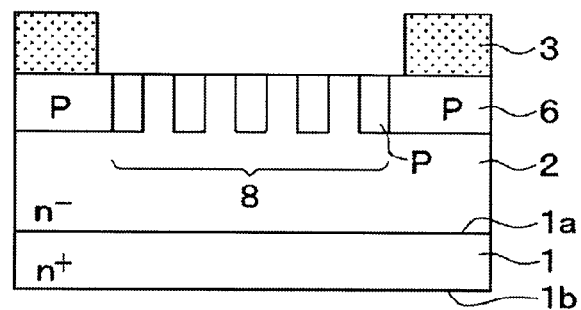
FIG. 11D is a cross-sectional view partially illustrating a process of manufacturing the SIC semiconductor device illustrated in FIG. 8.
Figure 11E:
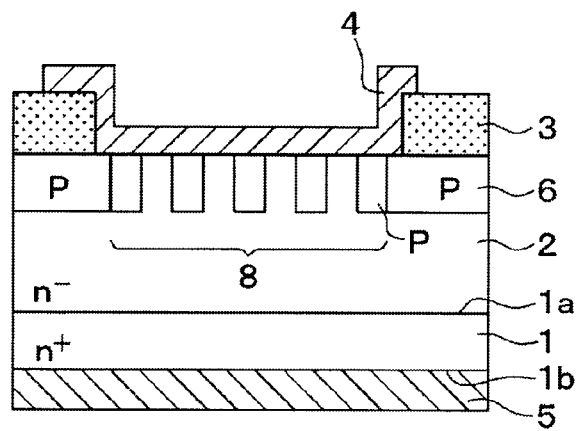
FIG. 11E is a cross-sectional view partially illustrating a process of manufacturing the SiC semiconductor device illustrated in FIG. 8.

Therefore, as illustrated in FIG. 10, the stacking faults extending in the off direction are more likely to be included in the p type layers 8, and at least a part of the stacking faults can be further more likely to be included in the p type layers 8.

Subsequently, a method for manufacturing the SiC semiconductor device according to the present embodiment will be described with reference to FIGS. 11A to 11E. In FIGS. 11A to 11E, the p type guard ring layers 7 are omitted.

First, an SiC substrate having an off angle where an off direction to a (0001) plane is a (1-100) direction is prepared as the n⁺ type substrate 1. Then, as processes illustrated in FIGS. 11A and 11B, the same processes as those in FIGS. 4A and 4B described in the first embodiment are performed. Subsequently, in a process illustrated in FIG. 11C, the mask 11 made of LTO or the like is arranged, and regions of the mask 11 in which the p type layers 8 are to be formed are opened in a photolithography etching process. Even in this case, most of the crystal defects are included in the regions in which the p type layers 8 are to be formed even if mask alignment is performed without checking the defects such as stacking faults. However, if the mask alignment is performed while confirming the crystal defects, more crystal defects can be included in the regions where the p type layers 8 are to be formed.

Then, p type impurity such as Al is ion-implanted with the use of the mask 11, and is activated by heat treatment to form the p type layers 8. In this case, the longitudinal direction of the p type layers 8 is arranged in the direction perpendicular to the off direction, the width direction of the p type layers 8 is arranged in the same direction as the off direction, and the widths W2 of the p type layers 8 are set to be equal to or larger than d/tan θ. Then, as processes illustrated in FIGS. 11D and 11E, the same processes as those in FIGS. 4D and 4E described in the first embodiment are performed. As a result, the SiC semiconductor device according to the present embodiment is completed.

As described above, even when the longitudinal direction of the p type layers 8 are set as the direction perpendicular to the off direction, if the widths W2 of the p type layers 8 are set to be equal to or larger than d/tan θ, the same advantages as those in the first embodiment can be obtained.

Other Embodiments

In the above embodiment, the SiC substrate the main surface of which has the off angle with respect to the (0001) plane is used as the n⁺ type substrate 1. Alternatively, an SiC substrate a main surface of which has an off angle with respect to the (000-1) plane may be used. As an example, a case in which the off-axis angle is 4 degrees is described. Alternatively, another angle, for example, 2 degrees may be employed.

Also, in the second embodiment, the p type layers 8 are formed by groove formation through dry etching, and the implantation into the grooves as against the first embodiment. Also in the third embodiment, the p type layers 8 can be formed through the same process.

In the above embodiment, the SiC semiconductor device in which the first conductivity type is an n type and the second conductivity type is a p type, has been described, but the respective conductivity types may be inverted.

In the case of indicating the crystal orientation, a bar (-) should be originally attached above a desired number, but because the expression is restricted based on electronic applications, the bar is attached in front of the desired number in the present specification.

The invention claimed is:

1. A silicon carbide semiconductor device having a junction barrier Schottky diode, comprising:
    a substrate including a main front surface and a rear surface, and made of silicon carbide of a first conductivity type having an off angle;
    a drift layer formed on the main front surface of the substrate, and made of silicon carbide of the first conductivity type which is lower in impurity concentration than the substrate;
    an insulating film arranged on the drift layer, and having an opening in a cell portion of the drift layer;
    a Schottky barrier diode including a Schottky electrode that is formed in the cell portion and is formed to come in Schottky contact with a surface of the drift layer through the opening of the insulating film, and an ohmic electrode that is formed on the rear surface of the substrate; and
    a plurality of second conductivity type layers formed below a region of the Schottky electrode which comes in contact with the drift layer so as to be connected to the Schottky electrode on the surface of the drift layer, and arranged to be spaced apart from each other, wherein
    a PN diode is configured by the plurality of second conductivity type layers and the drift layer, and
    the plurality of second conductivity type layers is formed in stripes only in a direction parallel to a rod-shaped stacking fault.

2. The silicon carbide semiconductor device according to claim 1, wherein
    the rod-shaped stacking fault extends along an off direction of the substrate.

3. The silicon carbide semiconductor device according to claim 1, wherein
    the Schottky electrode comes in Schottky contact with the surface of the drift layer, and is made of a material insulated from surfaces of the plurality of second conductivity type layers.

4. The silicon carbide semiconductor device according to claim 1, wherein
    the Schottky electrode is made of any one of Au, Ni, Ti, and Mo.

5. The silicon carbide semiconductor device according to claim 1, wherein
    each width of the plurality of second conductivity type layers is equal to or larger than a thickness of the rod-shaped stacking fault in the same direction as the width.

6. The silicon carbide semiconductor device according to claim 5, wherein
    each width of the plurality of second conductivity type layers is equal to or larger than 1 μm and equal to or smaller than 3 μm.

7. The silicon carbide semiconductor device according to claim 1, wherein
    the plurality of second conductivity type layer is disposed apart from each other at equal intervals, and has a width equal to each other.

8. The silicon carbide semiconductor device according to claim 1, wherein
the rod-shaped stacking fault wholly enters inside of the plurality of second conductivity type layers.

* * * * *